(12) United States Patent
Kim

(10) Patent No.: US 11,842,912 B2
(45) Date of Patent: Dec. 12, 2023

(54) WAFER TRANSPORT BOX

(71) Applicant: 3S Korea Co., Ltd., Seoul (KR)

(72) Inventor: Sang Jin Kim, Gyeonggi-do (KR)

(73) Assignee: 3S Korea Co., Ltd., Seoul (KR)

( * ) Notice: Subject to any disclaimer, the term of this patent is extended or adjusted under 35 U.S.C. 154(b) by 0 days.

(21) Appl. No.: 17/866,713

(22) Filed: Jul. 18, 2022

(65) Prior Publication Data

US 2023/0072884 A1 Mar. 9, 2023

(30) Foreign Application Priority Data

Sep. 7, 2021 (KR) ........................ 10-2021-0119098

(51) Int. Cl.
*H01L 21/673* (2006.01)

(52) U.S. Cl.
CPC .. *H01L 21/67386* (2013.01); *H01L 21/67369* (2013.01); *H01L 21/67383* (2013.01)

(58) Field of Classification Search
CPC ......... H01L 21/67369; H01L 21/67386; H01L 21/67383; H01L 21/67373; H01L 21/67353; H01L 21/67366
USPC ......................................... 206/710–712, 832
See application file for complete search history.

(56) References Cited

U.S. PATENT DOCUMENTS

| | | | | |
|---|---|---|---|---|
| 6,286,684 B1 * | 9/2001 | Brooks | ............ | H01L 21/67396 206/523 |
| 6,988,620 B2 * | 1/2006 | Haggard | ........... | H01L 21/67386 206/710 |
| 6,988,621 B2 * | 1/2006 | Forsyth | ............ | H01L 21/67369 206/710 |
| 7,565,980 B2 * | 7/2009 | Forsyth | ............ | H01L 21/67369 206/710 |
| 7,578,392 B2 * | 8/2009 | Brooks | ............ | H01L 21/67373 206/832 |
| 8,286,797 B2 * | 10/2012 | Pylant | ............... | H01L 21/67379 206/454 |

(Continued)

FOREIGN PATENT DOCUMENTS

| | | |
|---|---|---|
| JP | H09-129719 A | 5/1997 |
| JP | 2004-262545 A | 9/2004 |

(Continued)

OTHER PUBLICATIONS

Office action dated Jul. 18, 2023 from Japan Intellectual Property Office in a counterpart Japanese Patent Application No. 2022-118503 (all the cited references are listed in this IDS.) (English translation is also submitted herewith.).

*Primary Examiner* — Chun Hoi Cheung
(74) *Attorney, Agent, or Firm* — The PL Law Group, PLLC

(57) ABSTRACT

A wafer transport box according to an embodiment of the present disclosure includes a lower housing including a bottom plate and at least one lower rib which is formed vertically on an upper surface of the bottom plate and which forms a wall formed in an arc shape so that wafers are stacked in an inner space, an upper housing including an upper plate and an upper rib which is formed vertically on a lower surface of the upper plate and which forms a wall formed in an arc shape, and a sidewall member coupled inside the lower rib. Further, when the upper housing and the lower housing are coupled to each other, the sidewall member fixes the wafers stacked in the inner space.

13 Claims, 5 Drawing Sheets

(56) References Cited

U.S. PATENT DOCUMENTS

| | | | |
|---|---|---|---|
| 8,528,737 B2* | 9/2013 | Pylant | H01L 21/67373 |
| | | | 206/454 |
| 8,813,964 B2* | 8/2014 | Pylant | H01L 21/67373 |
| | | | 206/454 |
| 2006/0180499 A1* | 8/2006 | Forsyth | H01L 21/67369 |
| | | | 206/710 |
| 2007/0012594 A1* | 1/2007 | Forsyth | H01L 21/67386 |
| | | | 206/832 |
| 2010/0236977 A1 | 9/2010 | Pylant et al. | |
| 2011/0049006 A1 | 3/2011 | Pylant et al. | |

FOREIGN PATENT DOCUMENTS

| | | |
|---|---|---|
| JP | 2005-347734 A | 12/2005 |
| JP | 2008-141131 A | 6/2008 |
| KR | 10-2002-0081929 A | 10/2002 |
| KR | 20-0342507 Y1 | 2/2004 |
| WO | WO 2005/006405 A2 | 1/2005 |

* cited by examiner

WAFER TRANSPORT BOX

CROSS REFERENCE TO RELATED APPLICATION AND CLAIM OF PRIORITY

The application claims the benefit under 35 USC § 119 of Korean Patent Application No. 10-2021-0119098, filed Sep. 7, 2021, in the Korean Intellectual Property Office, the entire disclosure of which is incorporated herein by reference for all purposes.

BACKGROUND

1. Field of the Invention

The present disclosure relates to a wafer transport box. More particularly, the present disclosure relates to a wafer transport box having a fixing means that fixes stacked wafers so as to uniformly maintain vibration, shock, and the like that are generated when the wafers are transported to a minimum.

2. Description of the Related Art

Generally, a wafer is a high-precision product for manufacturing a semiconductor element. Further, when the wafer is transported and stored, the wafer is required to be stored in a storage container that is separately manufactured so that dust or various organic materials are prevented from adhering to the wafer and the storage container protects the wafer from external impact.

The wafers that are stacked are stored in a wafer transport box, and the wafer transport box safely stores multiple wafers that are stacked. At this time, a means capable of minimizing vibration, shock, and the like that are generated when the wafers stacked in the wafer transport box are moved is required.

As a conventional technology, Korean Patent No. 2002-81929 has been proposed. In this technology, a wafer storage container including a lower container having a cylindrical side wall, a circular groove accommodating an upper end portion of the cylindrical side wall of the lower container, and an upper container having a container wall body that extends downward such that the lower container can be covered is provided.

According to the wafer storage container, a cushion material is seated on an inner diameter of a cylinder of the lower container, and then a plurality of wafers is stacked on the cushion material. At this time, an interleaving paper is inserted between the wafers, so that direct contact between the wafers is prevented. When stacking of the wafers is completed, the cushion material is seated on the wafer at the top layer, and then the upper container covers the lower container and the lower container is sealed. Finally, the lower container and the upper container are fixed to each other by using a tape.

However, in the conventional wafer storage container as described above, there is a hassle of having to fix the lower container and the upper container one by one with the tape. In addition, the conventional wafer storage container has a disadvantage that the conventional wafer storage container cannot be stacked in multiple-stages. That is, when a storage container in which wafers are stacked is stored and transported conventionally, the storage containers are stacked in multiple-stages and then the storage containers are stored or transported. However, since the conventional storage container is configured such that the conventional storage containers are difficult to be stacked in multiple-stages, there is a disadvantage that the stacked conventional storage containers fall down and are disordered.

In addition, as another conventional technology, another type of a storage container has been proposed in Korean Utility Model Registration No. 20-0342507.

This storage container includes: a lower container having a cylinder-shaped wafer accommodating chamber opened by removing at least a portion of a side surface thereof; an upper container coupled to the lower container such that the wafer accommodating chamber is covered; and a fastening portion which is formed integrally with the upper container and/or the lower container and which is fastened by being engaged so as to maintain a coupled state of the upper container and the lower container. Further, an upper surface of the upper container and a lower surface of a lower container respectively have a plate surface profile that is form-fitted when at least a portion of each of the upper surface of the upper container and the lower surface of the lower container are facing with each other.

In addition, the fastening portion includes a hook portion formed integrally with any one of the lower container and the upper container. Further, a locking hole where the hook portion is inserted into and locked on is formed in the other one of the lower container and the upper container.

However, in the storage container as described above, the accommodating chamber in which the wafers are accommodated is difficult to be safely protected. Further, when the wafers are stacked and stored, there is a risk that a main body is shaken and the wafer is damaged.

SUMMARY

Accordingly, the present disclosure has been made keeping in mind the above problems occurring in the related art, and an objective of the present disclosure is to provide a wafer transport box having a fixing means that fixes stacked wafers so as to uniformly maintain vibration, shock, and the like that are generated when the wafers are transported to a minimum.

In order to achieve the above objective, according to one aspect of the present disclosure, there is provided a wafer transport box including: a lower housing including a bottom plate and at least one lower rib which is formed vertically on an upper surface of the bottom plate and which forms a wall formed in an arc shape so that wafers are stacked in an inner space; an upper housing including an upper plate and an upper rib which is formed vertically on a lower surface of the upper plate and which forms a wall formed in an arc shape; and a sidewall member coupled inside the lower rib, wherein, when the upper housing and the lower housing are coupled to each other, the sidewall member may fix the wafers stacked in the inner space.

Here, the lower housing may include at least one latch on each corner of the upper surface of the bottom plate, the latch coupling and fixing the upper housing when the lower housing is coupled to the upper housing, and the upper housing may include at least one latch hole which is positioned on a position on each corner of the upper plate corresponding to the latch and to which the latch is coupled and fixed.

Here, the latch may include: a first latch member which is positioned at an outer portion of the lower rib on the bottom plate and which forms a floor on the upper surface of the bottom plate; a second latch member formed in a vertical direction to the first latch member such that the second latch member is facing the lower rib; and a third latch member that protrudes toward an inner surface of the second latch member, wherein, when the upper housing and the lower housing are coupled to each other, the third latch member may be fixed and coupled to the latch hole.

Here, the lower housing may further include a support member that supports the lower rib, and the support member may be disposed between the latch and the lower rib and may be formed in an arc shape along the lower rib on a lower end portion of the lower rib.

Here, the lower housing may further include a sidewall groove which is formed inside the lower rib and which has a space, the sidewall member may further include a sidewall fixing member that protrudes on a lower end portion of the sidewall member, and the sidewall fixing member may fix the sidewall member to the lower housing by being coupled to the sidewall groove.

Here, the upper housing may further include an inner member formed inside the upper rib, the inner member may be in contact with an upper end of the sidewall member when the upper housing and the lower housing are coupled to each other, and the lower rib may be in contact with a lower end of the sidewall member, thereby fixing the wafers stacked in the inner space.

Here, the upper housing may include: a first protrusion member that protrudes downward on a lower surface of the upper housing; and a second protrusion member which protrudes downward on the lower surface of the upper housing and which is formed inward of the first protrusion member, wherein, when the upper housing and the lower housing are coupled to each other, the first protrusion member may be fitted between an upper end of the sidewall member and a ring frame, and the second protrusion member may press and fix a top most wafer.

Here, the sidewall member may further include a middle groove at a center of an outer side surface of the sidewall member, and the lower rib may further include at least one hook member which is provided at an upper portion of the lower rib and which is spaced apart from each other at a predetermined distance and which fixes the sidewall member by being coupled to the middle groove of the sidewall member when the sidewall member is coupled to the lower housing.

According to the present disclosure, the wafer transport box having the fixing means that fixes the stacked wafer so as to uniformly maintain vibration, shock, and the like that are generated when the wafers are transported to a minimum may be provided.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION

Figure 1:
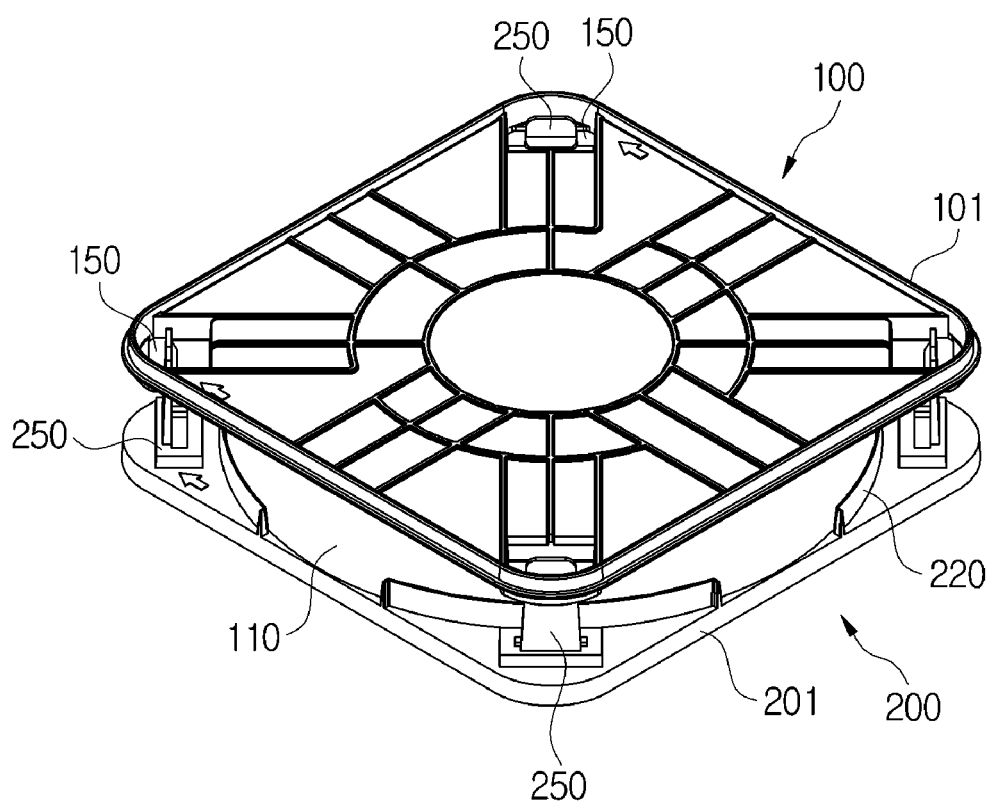
FIG. 1 is a view schematically illustrating an overall configuration of a wafer transport box according to an embodiment of the present disclosure.

Since the present disclosure may be variously changed and have various embodiments, particular embodiments will be exemplified and described in the drawings. However, it should be understood that the specific embodiments according to the concept of the present disclosure are not limited to the embodiments which will be described hereinbelow with reference to the accompanying drawings, but all of modifications, equivalents, and substitutions are included in the scope and spirit of the present disclosure.

In describing the present disclosure, a detailed description of known technologies will be omitted when it may obscure the subject matter of the present disclosure. In addition, ordinals (e.g., first, second, etc.) used in this specification are merely used to distinguish one component from another component.

Also, in the present specification, it will be understood that when elements are "connected" or "coupled" to each other, the elements may be directly connected or coupled to each other, but may alternatively be connected or coupled to each other with an intervening element therebetween, unless specified otherwise.

Hereinafter, exemplary embodiments of the present disclosure will be described in detail with reference to the attached drawings.

FIG. 1 is a view schematically illustrating an overall configuration of a wafer transport box according to an embodiment of the present disclosure.

Figure 2:
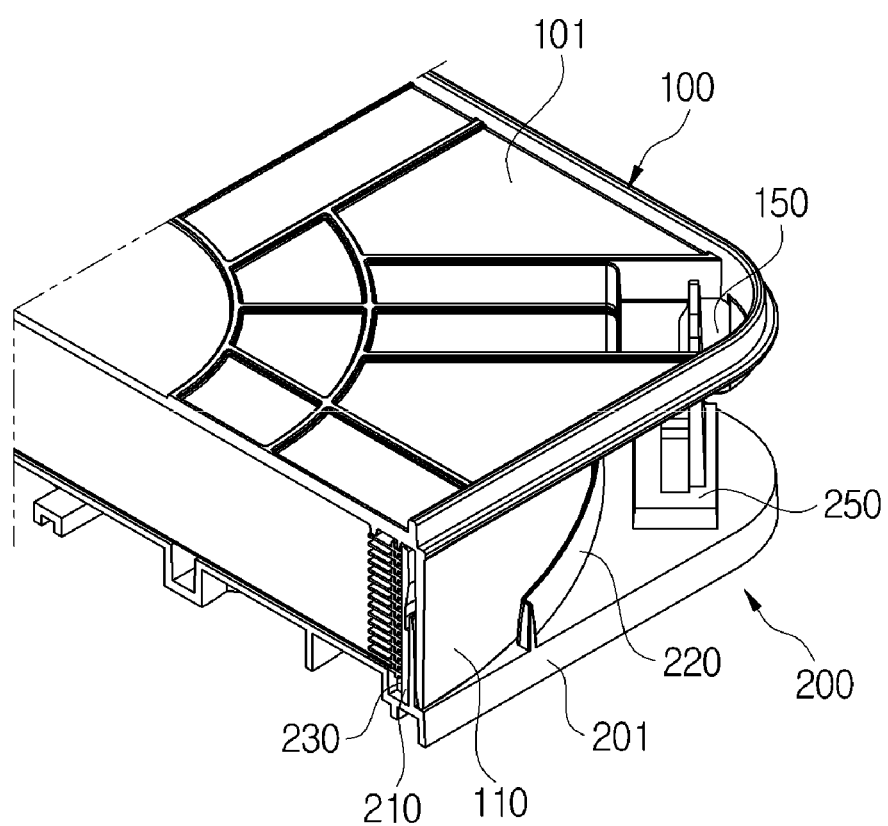
FIG. 2 is a view illustrating a partial cross-section of FIG. 1.

FIG. 2 is a view illustrating a partial cross-section of FIG. 1.

Figure 3:
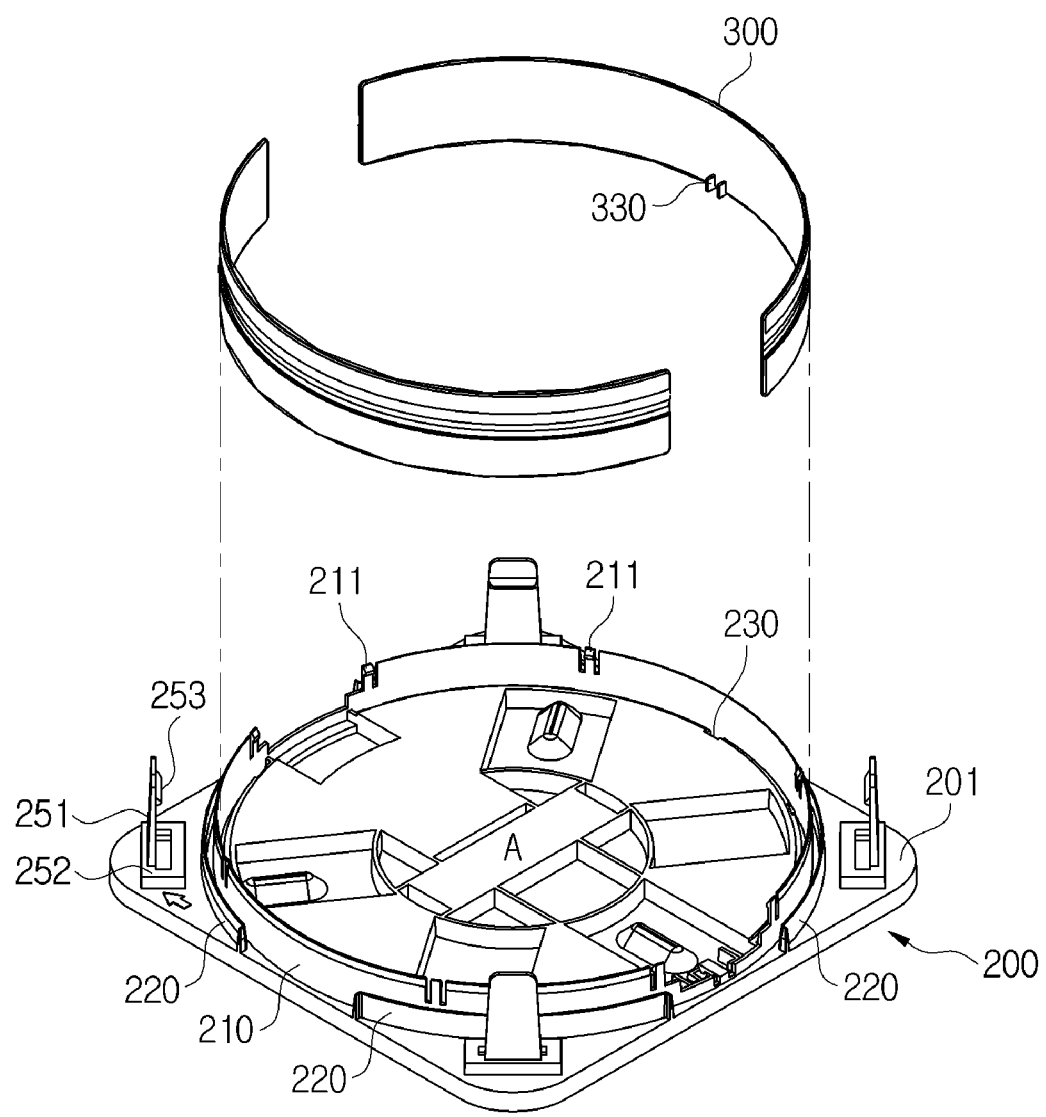
FIG. 3 is a view illustrating a configuration of a lower housing and a sidewall member.

FIG. 3 is a view illustrating a configuration of a lower housing and a sidewall member.

Figure 4:
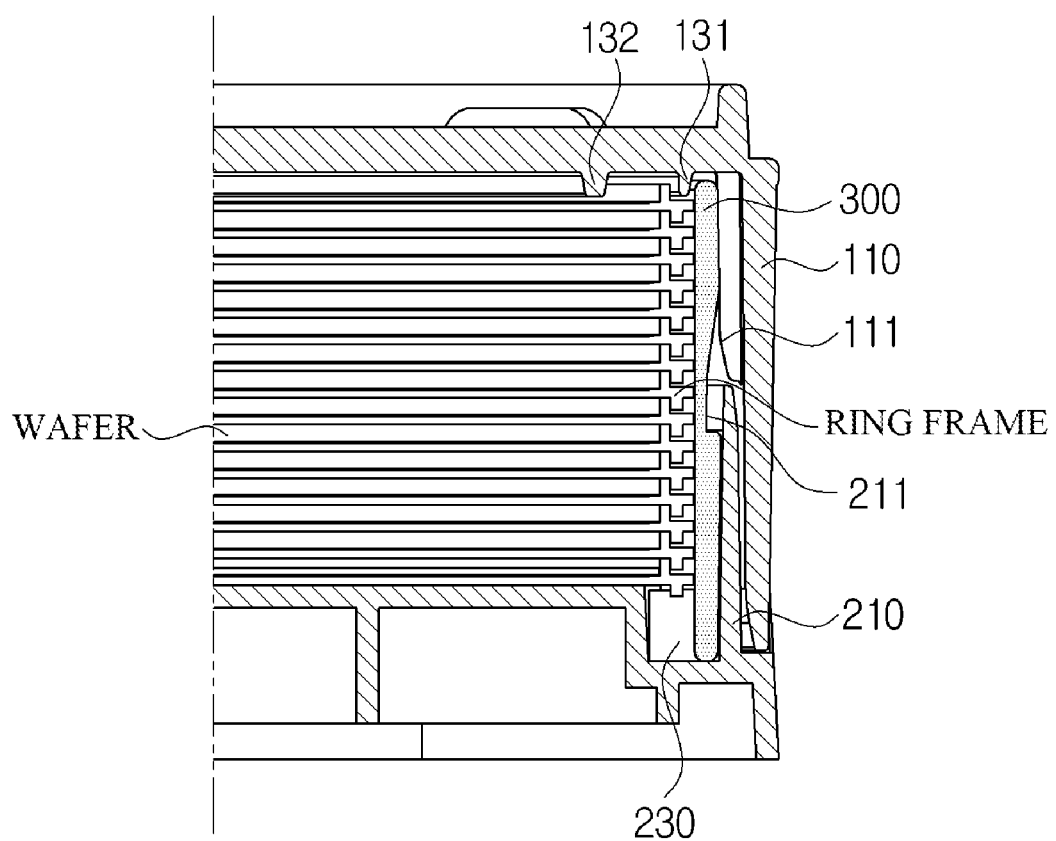
FIG. 4 is a view illustrating a partial cross-section of FIG. 3.

FIG. 4 is a view illustrating a partial cross-section of FIG. 3.

Figure 5:
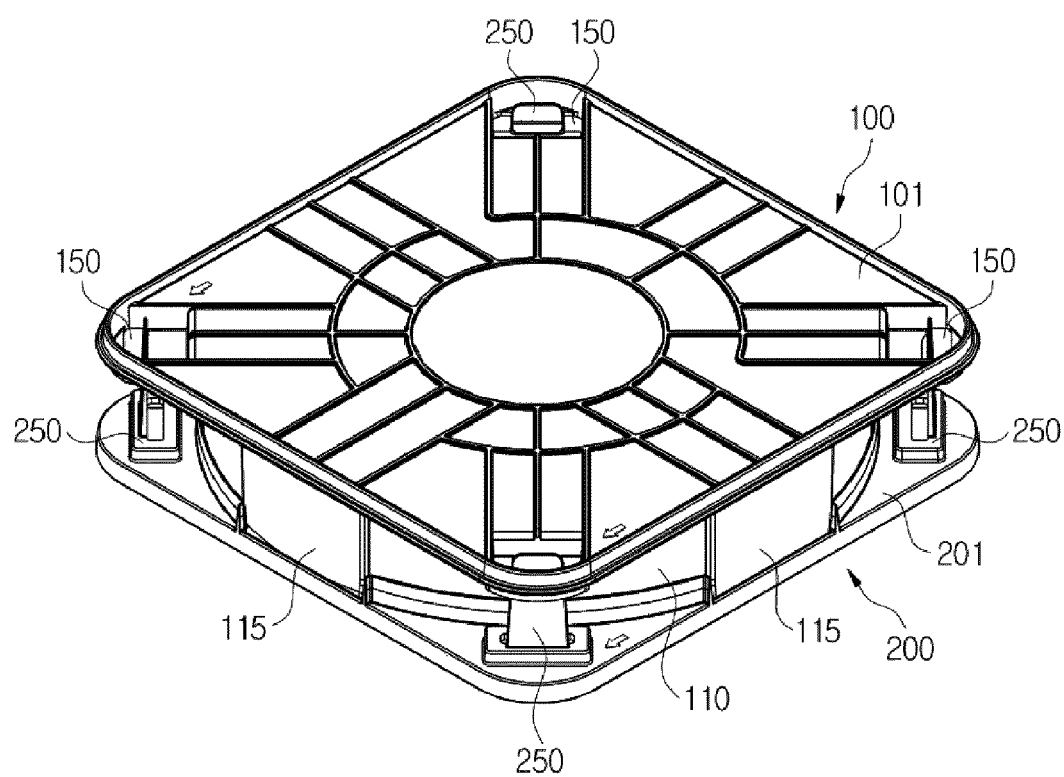
FIG. 5 is a view illustrating another embodiment of an upper housing.

FIG. 5 is a view illustrating another embodiment of an upper housing.

Referring to FIGS. 1 to 5, a wafer transport box according to the present disclosure includes an upper housing 100, a lower housing 200, and a sidewall member 300.

The upper housing 100 includes an upper plate 101, and includes an upper rib 110 which is formed vertically on a lower surface of the upper plate 101 and which forms a wall formed in an arc shape.

The upper housing 100 has an arc of 360 degrees, and is formed as a single structure. However, the upper housing 100 may be formed together with the lower housing 200, and the number of components formed together with the upper housing 100 is not limited.

The lower housing 200 includes a bottom plate 201, and includes at least one lower rib 210 which is formed vertically on an upper surface of the bottom plate 201 and which forms a wall formed in an arc shape such that a wafer is stacked in an inner space A. As illustrated in FIGS. 1 to 4, the lower rib 210 may be formed in two, but the number of lower ribs 210 is not limited.

The upper housing 100 and the lower housing 200 are coupled to each other, and stack and store the wafers in an inner portion thereof. Further, when the upper housing 100 and the lower housing 200 are coupled to each other, the upper rib 110 is coupled such that the upper rib 110 is disposed outside the lower rib 210.

On each corner of the upper surface of the bottom plate 201, the lower housing 200 may include at least one latch 250 that couples and fixes the upper housing 100 when the lower housing 200 is coupled to the upper housing 100. Further, on a position on each corner corresponding to the latch 250, the upper housing 100 may include at least one latch hole 150 to which the latch 250 is coupled and fixed.

The latch 250 and the latch hole 150 are coupled to each other. Preferably, the latch 250 and the latch hole 150 are formed in the same number.

The latch 250 may include: a first latch member 252 which is positioned at an outer portion of the lower rib 210 and which forms a floor on the upper surface of the bottom plate 201; a second latch member 251 formed in a vertical direction to the first latch member 252 such that the second latch member 251 is facing the lower rib 210; and a third latch member 253 that protrudes toward an inner surface of the second latch member 251. When the upper housing 100 and the lower housing 200 are coupled to each other, the third latch member 253 is fixed and coupled to the latch hole 150.

The lower housing 200 may further include a support member 220 that supports the lower rib 210.

The support member 220 may be disposed between the latch 250 and the lower rib 210, and may be formed in an arc shape along the lower rib 210 on a lower end portion of the lower rib 210.

In an embodiment of the present disclosure, the support member 220 may be formed in an arc of less than 90 degrees. At least one support member 220 may be provided.

The lower rib 210 and the support member 220 are spaced apart from each other at a predetermined distance. Further, when the upper housing 100 is coupled to the lower housing 200, the upper rib 110 is fitted between the lower rib 210 and the support member 220, so that the wafers stacked in the inner space A can be supported and fixed.

In an embodiment of the present disclosure, a height of the support member 220 may be lower than a height of the lower rib 210.

The upper housing 100 may further include a fixing member 115 that is formed on an outer surface of the upper rib 110.

On the outer surface of the upper rib 110, the fixing member 115 is positioned between two latch holes 150. Therefore, when the upper housing 100 is coupled to the lower housing 200, the fixing member 115 is fitted between two support members 220, and the wafers stacked in the inner space A may be more rigidly fixed.

The sidewall member 300 is coupled to an inner side surface of the lower rib 210, and forms a wall while forming an arc together with the lower rib 210. A bottom plate groove to which the sidewall member 300 can be coupled is formed in the inner side surface of the lower rib 210, so that the sidewall member 300 is coupled to the bottom plate groove. A height of the sidewall member 300 is higher than a height of the lower rib 210, and includes a middle groove at a center of an outer side surface of the sidewall member 300.

The lower rib 210 may further include a hook member 211. At least one of the hook members 211 may be provided on an upper portion of the lower rib 210 while being spaced apart from each other at a predetermined distance. The hook member 211 includes a hook portion that protrudes inward on an upper end portion of the hook member 211.

When the sidewall member 300 is coupled to the lower housing 200, the hook member 211 may fix the sidewall member 300 by being coupled to the middle groove of the sidewall member 300.

The sidewall member 300 may have an arc of less than 180 degrees, and is coupled to the lower rib 210. Preferably, the number of the sidewall members 300 is the same as the number of the lower ribs 210.

The sidewall member 300 may further include a sidewall fixing member 330 that protrudes inward on a lower end portion of an inner side surface of the sidewall member 300.

As illustrated in FIG. 3, one sidewall fixing member 330 may be provided on one sidewall member 300, but at least one of the sidewall fixing members 330 may be provided while being spaced apart from each other at a predetermined distance.

The sidewall fixing member 330 fixes the sidewall member 300 by being coupled to a sidewall member groove 230.

The sidewall member groove 230 may be provided as a separate groove formed in the bottom plate groove where the sidewall member 300 is coupled to the inner portion of the lower rib 210 of the bottom plate 201. As the sidewall fixing member 330 is coupled to the sidewall member groove 230, the sidewall member 300 may be more rigidly fixed such that the sidewall member 300 is not separated from the lower housing 200.

The upper housing 100 may further include an inner member 111 on an inner portion of the upper rib 110. When the upper housing 100 and the lower housing 200 are coupled to each other, the inner member 111 is in contact with the upper end of the sidewall member 300 and the lower rib 210 is in contact with the lower end of the sidewall member 300, thereby fixing the wafers stacked in the inner space A.

Here, preferably, when the upper housing 100 and the lower housing 200 are coupled to each other, the upper end portion of the lower rib 210 and a lower end portion of the inner member 111 are coupled to each other by being engaged with each other.

The upper housing 100 may further include a first protrusion member 131 and a second protrusion member 132.

The first protrusion member 131 protrudes downward on the lower surface of the upper housing 100. Further, when the upper housing 100 and the lower housing 200 are coupled to each other, the first protrusion member 131 is fitted between the upper end of the sidewall member 300 and a topmost ring frame.

The second protrusion member 132 protrudes downward on the lower surface of the upper housing 100 and is formed inward of the first protrusion member 131, and may fix a topmost wafer by pressing the topmost wafer.

According to the present disclosure, by coupling the sidewall member 300 to the lower housing 200, a space is formed at the inner portion of the upper housing 100 and the lower housing 200 by only coupling the upper housing 100 and the lower housing 200 when the wafers are stacked and stored or are moved. Therefore, when the wafers are moved, safety may be increased by minimizing the wafers from receiving vibration, shock, and so on.

Accordingly, a scope of the inventive concept is not limited to the above-described embodiments. The inventive concept may be embodied in various forms of embodiments within a scope of the appended claims. Thus, any person of ordinary skill in the art may understand that modifications without departing from the gist of the inventive concept as claimed in the claims fall within the scope of the claims of the inventive concept.

What is claimed is:

1. A wafer transport box comprising:
    a lower housing comprising a bottom plate and at least one lower rib which is formed vertically on an upper surface of the bottom plate and which forms a wall formed in an arc shape so that wafers are stacked in an inner space;
    an upper housing comprising an upper plate and an upper rib which is formed vertically on a lower surface of the upper plate and which forms a wall formed in an arc shape; and a sidewall member coupled inside the lower rib,
wherein, when the upper housing and the lower housing are coupled to each other, the sidewall member fixes the wafers stacked in the inner space,
wherein the lower housing further comprises a sidewall groove which is formed inside the lower rib and which has a space,
the sidewall member further comprises a sidewall fixing member that protrudes on a lower end portion of the sidewall member, and
the sidewall fixing member fixes the sidewall member to the lower housing by being coupled to the sidewall groove.

2. The wafer transport box of claim 1, wherein the lower housing comprises at least one latch on each corner of the upper surface of the bottom plate, the latch coupling and fixing the upper housing when the lower housing is coupled to the upper housing, and the upper housing comprises at least one latch hole which is positioned on a position on each corner of the upper plate corresponding to the latch and to which the latch is coupled and fixed.

3. The wafer transport box of claim 2, wherein the latch comprises:
a first latch member which is positioned at an outer portion of the lower rib on the bottom plate and which forms a floor on the upper surface of the bottom plate;
a second latch member formed in a vertical direction to the first latch member such that the second latch member is facing the lower rib; and
a third latch member that protrudes toward an inner surface of the second latch member,
wherein, when the upper housing and the lower housing are coupled to each other, the third latch member is fixed and coupled to the latch hole.

4. The wafer transport box of claim 3, wherein the lower housing further comprises a support member that supports the lower rib, and the support member is disposed between the latch and the lower rib and is formed in an arc shape along the lower rib on a lower end portion of the lower rib.

5. The wafer transport box of claim 1, wherein the upper housing further comprises an inner member formed inside the upper rib, the inner member is in contact with an upper end of the sidewall member when the upper housing and the lower housing are coupled to each other, and the lower rib is in contact with a lower end of the sidewall member, thereby fixing the wafers stacked in the inner space.

6. The wafer transport box of claim 1, wherein the sidewall member further comprises a middle groove at a center of an outer side surface of the sidewall member, and the lower rib further comprises at least one hook member which is provided at an upper portion of the lower rib and which is spaced apart from each other at a predetermined distance and which fixes the sidewall member by being coupled to the middle groove of the sidewall member when the sidewall member is coupled to the lower housing.

7. A wafer transport box comprising:
a lower housing comprising a bottom plate and at least one lower rib which is formed vertically on an upper surface of the bottom plate and which forms a wall formed in an arc shape so that wafers are stacked in an inner space;
an upper housing comprising an upper plate and an upper rib which is formed vertically on a lower surface of the upper plate and which forms a wall formed in an arc shape; and
a sidewall member coupled inside the lower rib,
wherein, when the upper housing and the lower housing are coupled to each other, the sidewall member fixes the wafers stacked in the inner space,
wherein the upper housing comprises:
a first protrusion member that protrudes downward on a lower surface of the upper housing; and
a second protrusion member which protrudes downward on the lower surface of the upper housing and which is formed inward of the first protrusion member,
wherein, when the upper housing and the lower housing are coupled to each other, the first protrusion member is fitted between an upper end of the sidewall member and a ring frame, and the second protrusion member presses and fixes a topmost wafer.

8. The wafer transport box of claim 7, wherein the lower housing comprises at least one latch on each corner of the upper surface of the bottom plate, the latch coupling and fixing the upper housing when the lower housing is coupled to the upper housing, and the upper housing comprises at least one latch hole which is positioned on a position on each corner of the upper plate corresponding to the latch and to which the latch is coupled and fixed.

9. The wafer transport box of claim 8, wherein the latch comprises:
a first latch member which is positioned at an outer portion of the lower rib on the bottom plate and which forms a floor on the upper surface of the bottom plate;
a second latch member formed in a vertical direction to the first latch member such that the second latch member is facing the lower rib; and
a third latch member that protrudes toward an inner surface of the second latch member,
wherein, when the upper housing and the lower housing are coupled to each other, the third latch member is fixed and coupled to the latch hole.

10. The wafer transport box of claim 9, wherein the lower housing further comprises a support member that supports the lower rib, and the support member is disposed between the latch and the lower rib and is formed in an arc shape along the lower rib on a lower end portion of the lower rib.

11. The wafer transport box of claim 1, wherein the lower housing further comprises a sidewall groove which is formed inside the lower rib and which has a space, the sidewall member further comprises a sidewall fixing member that protrudes on a lower end portion of the sidewall member, and the sidewall fixing member fixes the sidewall member to the lower housing by being coupled to the sidewall groove.

12. The wafer transport box of claim 11, wherein the upper housing further comprises an inner member formed inside the upper rib, the inner member is in contact with an upper end of the sidewall member when the upper housing and the lower housing are coupled to each other, and the lower rib is in contact with a lower end of the sidewall member, thereby fixing the wafers stacked in the inner space.

13. The wafer transport box of claim 7, wherein the sidewall member further comprises a middle groove at a center of an outer side surface of the sidewall member, and the lower rib further comprises at least one hook member which is provided at an upper portion of the lower rib and which is spaced apart from each other at a predetermined distance and which fixes the sidewall member by being coupled to the middle groove of the sidewall member when the sidewall member is coupled to the lower housing.

* * * * *